United States Patent
Motoyoshi et al.

(10) Patent No.: US 6,806,782 B2
(45) Date of Patent: Oct. 19, 2004

(54) FREQUENCY SYNTHESIZER CIRCUIT (75) Inventors: Toshiro Motoyoshi, Kasugai (JP);
Kimihiko Nagata, Kasugai (JP)

(73) Assignee: Fujitsu Limited, Kanagawa (JP)

( * ) Notice: Subject to any disclaimer, the term of this patent is extended or adjusted under 35 U.S.C. 154(b) by 10 days.

(21) Appl. No.: 10/419,206

(22) Filed: Apr. 21, 2003

(65) Prior Publication Data

US 2003/0214360 A1 Nov. 20, 2003

(30) Foreign Application Priority Data

May 20, 2002 (JP) .................................. 2002-145304

(51) Int. Cl.[7] .............................. G01R 23/00; H03L 7/06
(52) U.S. Cl. .......................... 331/44; 331/1 A; 331/14; 331/17
(58) Field of Search ........................... 331/1 A, 8, 14, 331/17, 18, 25, 34, 44; 327/156–159

(56) References Cited

U.S. PATENT DOCUMENTS 5,942,949 A  *  8/1999  Wilson et al. ................ 331/17

FOREIGN PATENT DOCUMENTS

JP          07095069 A       4/1995

* cited by examiner

*Primary Examiner*—David Mis (57) ABSTRACT

The frequency synthesizer circuit includes a phase-locked loop (PLL) circuit, a voltage controlled oscillator (VCO), a low pass filter (LPF), an input terminal for providing serial data provided from the exterior to the PLL circuit, an output terminal for providing an oscillation signal provided the VCO, and a testing unit providing a testing voltage with a binary value to the VCO, wherein, the PLL circuit, the VCO, the LPF, and the testing unit are mounted on a single chip, and usability of the frequency synthesizer circuit is determined based on the oscillation signal provided from the VCO via said output terminal according to the testing voltage with a binary value provided from said testing unit.

8 Claims, 11 Drawing Sheets

| CONTROL BIT A | CONTROL BIT B | V |
|---|---|---|
| 0 | 0 | 0.5V FIXED (VCO LOWER LIMIT) |
| 0 | 1 | 2.5V FIXED (VCO UPPER LIMIT) |
| 1 | 0 | NORMAL |
| 1 | 1 | NORMAL |

| CONTROL BIT A | CONTROL BIT B | CONTROL BIT C | V | ch SELECTION SIGNAL | VCO ch SELECTION |
|---|---|---|---|---|---|
| 0 | 0 | 0 | 0.5V FIXED (VCO LOWER LIMIT) | s1 | LOWEST fch(0.25GHz) |
| 0 | 1 | 0 | 2.5V FIXED (VCO UPPER LIMIT) | s1 | LOWEST fch(2.43GHz) |
| 0 | 0 | 1 | 0.5V FIXED (VCO LOWER LIMIT) | s2 | HIGHEST fch(2.43GHz) |
| 0 | 1 | 1 | 2.5V FIXED (VCO UPPER LIMIT) | s2 | HIGHEST fch(2.75GHz) |
| 1 | 0 | — | NORMAL | — | — |
| 1 | 1 | — | NORMAL | — | — |

FREQUENCY SYNTHESIZER CIRCUIT

BACKGROUND OF THE INVENTION

1. Field of the Invention

The present invention relates to a frequency synthesizer circuit employing a phase-locked loop (PLL) circuit.

2. Description of the Related Art

Figure 1:
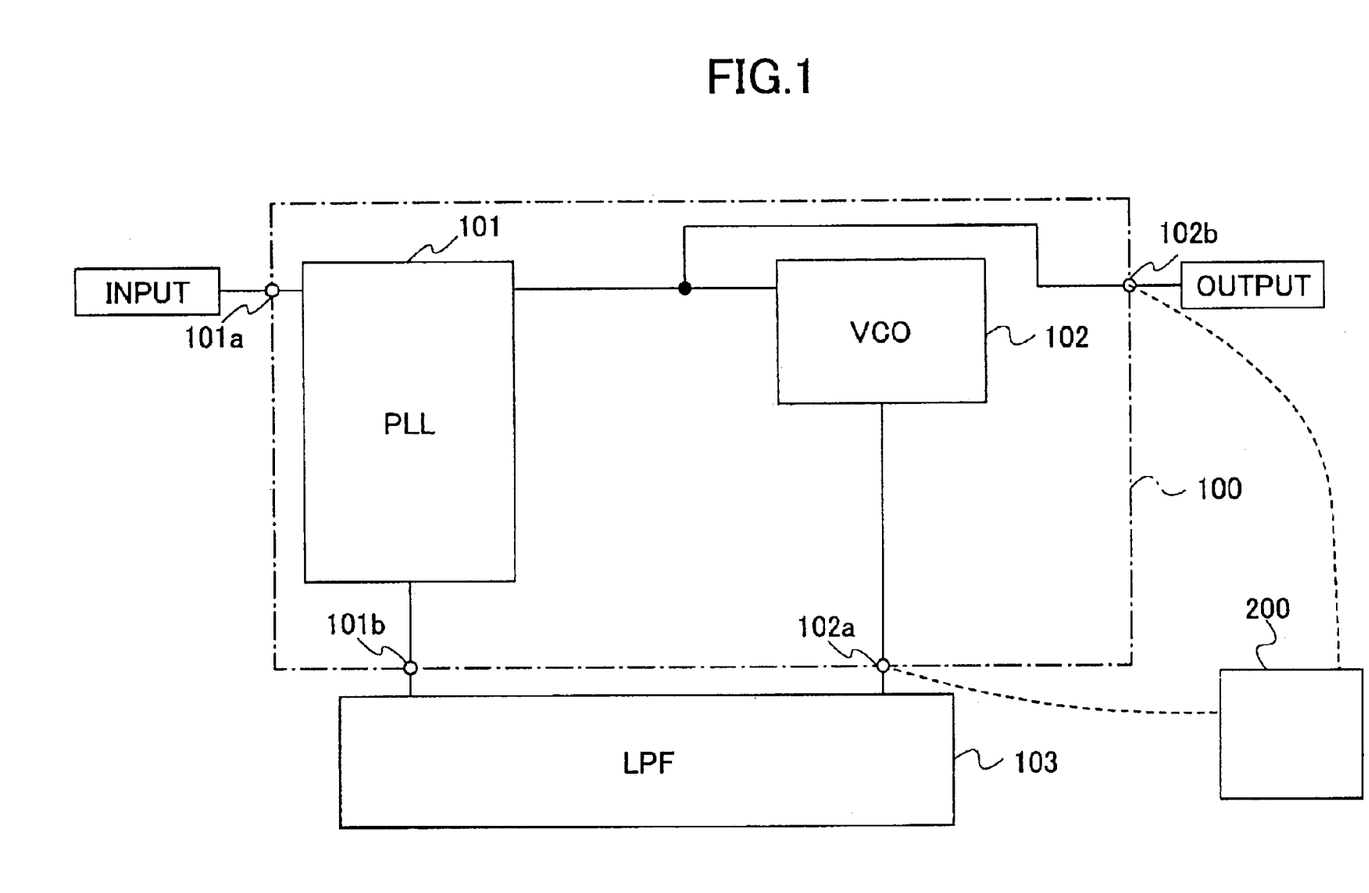
FIG. 1 is an overall schematic block diagram of a frequency synthesizer circuit according to the related art.

As shown in FIG. 1, a frequency synthesizer circuit according to the related art used in portable telephones, etc., which frequency synthesizer generates an output signal in phase with an input signal, comprises a PLL circuit 101, which is a digital circuit, a voltage controlled oscillator (VCO) 102, which is an analog circuit, and a low pass filter (LPF) 103. The PLL circuit 101 and the VCO 102 are mounted on a single substrate 100. Terminals 101a, 101b, 102a, and 102b are formed on the substrate 100 and the terminals 101b, 102a are externally connected to the LPF 103.

In such a configuration, when a so-called wafer probing test operation for the VCO 102 is to be performed, a control voltage is provided from a probe of a testing device 200 connected to the (input) terminal 102a and an oscillation signal provided from the VCO 102 based on the provided control voltage is detected by a probe of the testing device 200 connected to the (output) terminal 102b.

However, in order to respond to the demand for weight saving of the apparatus, nowadays, components configuring the frequency synthesizer circuit tend to be integrally mounted on a single substrate. Therefore, the frequency synthesizer according to the related art described above is also required to mount the PLL circuit, the VCO, and the LPF on a single chip.

The frequency synthesizer according to the related art may be reduced in the weight of the apparatus by mounting the components configuring the frequency synthesizer circuit on a single chip as mentioned above. However, in case when the frequency synthesizer circuit is integrated in the single chip, the input terminal 102a of the VCO is not exposed to the exterior. As a result, it is not possible to check an oscillation frequency provided from the VCO by the wafer probing test, which is performed on the frequency synthesizer circuit in a wafer status so as to determine if the VCO is working properly.

It is possible to devise exposing of the input terminal of the VCO to the exterior, but this cannot be adopted since even a small amount of leakage of noise components on the input terminal exposed to the exterior during an off-switch mode, i.e. non-testing mode, adversely affects the noise characteristic of the frequency synthesizer circuit. Therefore, it is preferable not to expose the input terminal of the VCO to the exterior in order to prevent the entering of the noise components into the frequency synthesizer circuit.

Also, it is possible to check the oscillation frequency provided from the VCO in the final test, which is performed after completing the assembly of the frequency synthesizer circuit into a final product such as a portable phone, etc., since a locked condition can be easily obtained by utilizing a closed loop of the PLL circuit in the frequency synthesizer circuit. However, the replacement cost occurring when detecting a defective chip in the final test, which is performed after the frequency synthesizer circuit is assembled into the final product, is significantly larger than that occurring when detecting a defective chip in the wafer probing test, which is performed on the frequency synthesizer circuit in a wafer status before the assembly of the frequency synthesizer circuit into the final product. Thus, it is preferable to check the oscillation frequency provided from the VCO in the wafer-probing test in terms of cost.

SUMMARY OF THE INVENTION

The present invention is directed to solve the above-mentioned problems and an object of the present invention is to provide a frequency synthesizer circuit, which can be easily tested by the wafer-probing test before the assembly of the frequency synthesizer circuit into a final product, without directly exposing a terminal of the VCO to the exterior.

The frequency synthesizer circuit according to the present invention includes a phase-locked loop circuit, a voltage controlled oscillator, a low pass filter, an input terminal for providing serial data provided from the exterior to the phase-locked loop circuit, an output terminal for providing an oscillation signal provided from the voltage controlled oscillator, and a testing unit providing a testing voltage with a binary value to the voltage controlled oscillator, wherein, the phase-locked loop circuit, the voltage controlled oscillator, the low pass filter, and the testing unit are mounted on a single chip, and usability of the frequency synthesizer circuit is determined based on the oscillation signal provided from the voltage controlled oscillator via the output terminal according to the testing voltage with a binary value provided from the testing unit.

According to the present invention, since the testing unit that provides the testing voltage with a binary value to the voltage controlled oscillator can be mounted integrally with the voltage controlled oscillator, the phase-locked loop circuit, and the low pass filter, the usability of the frequency synthesizer circuit can be determined based on the oscillation signal provided from the voltage controlled oscillator via the output terminal according to the testing voltage with a binary value provided from the testing unit, without exposing an input terminal of the voltage controlled oscillator to the exterior for connecting a probe of an external testing device. Therefore, it is possible to perform the oscillation frequency check on the frequency synthesizer circuit, particularly on the voltage controlled oscillator via the testing unit before assembling the frequency synthesizer circuit into the final product.

According to the present invention, if necessary, the testing unit may be provided between the low pass filter and the voltage controlled oscillator and the testing unit may provide the testing voltage with a binary value based on a control signal included in the serial data provided from the phase-locked loop circuit.

According to the present invention, since the testing unit may be provided between the low pass filter and the voltage controlled oscillator and the testing unit may provide the testing voltage with a binary value based on the control signal included in the serial data provided from the phase-locked loop circuit, the control signal included in the serial data may be provided from the input terminal to the testing unit via the phase-locked loop circuit and the usability of the frequency synthesizer circuit may be determined based on the oscillation signal provided from the voltage controlled oscillator via the output terminal according to the testing voltage with a binary value provided from the testing unit, without exposing an input terminal of the voltage controlled oscillator to the exterior for connecting a probe of an external testing device before assembling the frequency synthesizer circuit into the final product.

According to the present invention, if necessary, the testing unit may be provided in the phase-locked loop circuit and the low pass filter may be configured as a passive filter, wherein the testing voltage with a binary value provided from the testing unit may be provided to the voltage controlled oscillator via the low pass filter.

According to the present invention, since the testing unit may be provided in the phase-locked loop circuit and the low pass filter may be configured as a passive filter, the testing voltage may be provided to the voltage controlled oscillator via the passive filter, which is configuring the low pass filter, without directly connecting the testing unit to the voltage controlled oscillator.

According to the present invention, if necessary, the voltage controlled oscillator may provide the oscillation signal corresponding to a frequency band of a plurality of channels, the testing unit may switch a channel of the voltage controlled oscillator based on a channel selection signal provided from the phase-locked loop circuit, and the usability of the frequency synthesizer circuit may be determined based on the oscillation signal provided from the voltage controlled oscillator via the output terminal according to the testing voltage with a binary value provided from the testing unit.

According to the present invention, when the voltage controlled oscillator can provide the oscillation signal corresponding to a frequency band of a plurality of channels, the testing unit may switch the channel of the voltage controlled oscillator based on the channel selection signal provided from the phase-locked loop circuit, and therefore, the usability of the frequency synthesizer circuit may be determined based on the oscillation signal provided from the voltage controlled oscillator via the output terminal according to the testing voltage with a binary value provided from the testing unit and thus it may be possible to check the oscillation signal provided from the voltage controlled oscillator with respect to every channel to which the voltage controlled oscillator is adapted.

According to the present invention, if necessary, the phase-locked loop circuit may include a divider counter to divide a frequency of the oscillation signal provided from the voltage controlled oscillator and an output terminal, wherein the divided oscillation signal may be provided from the output terminal.

According to the present invention, since the phase-locked loop circuit may include a divider counter to divide the frequency of the oscillation signal provided from the voltage controlled oscillator and an output terminal, the divided oscillation signal may be provided from the output terminal. Therefore, the wafer-probing test may be performed using the divided oscillation signal, which has a lower frequency than the oscillation signal before being divided. This makes it significantly easy to carry out the wafer-probing test.

BRIEF DESCRIPTION OF THE DRAWINGS

Other objects, advantages, and further features of the present invention will become more apparent as the description proceeds taken in conjunction with the accompanying drawings in which.

DETAILED DESCRIPTION OF THE PREFERRED EMBODIMENTS

Figure 2:
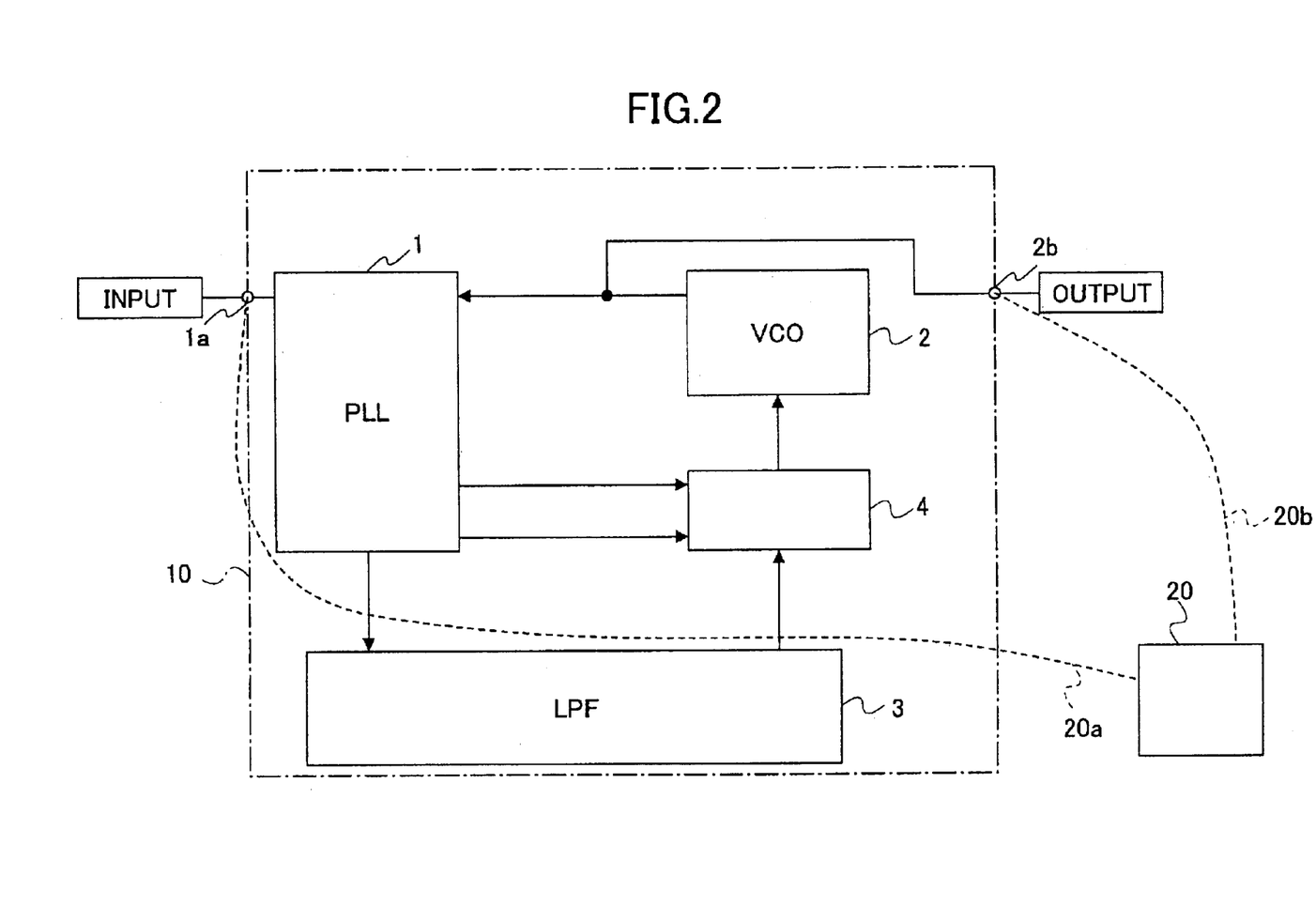
FIG. 2 is an overall schematic block diagram of a frequency synthesizer circuit according to a first embodiment of the present invention.
Figure 3:
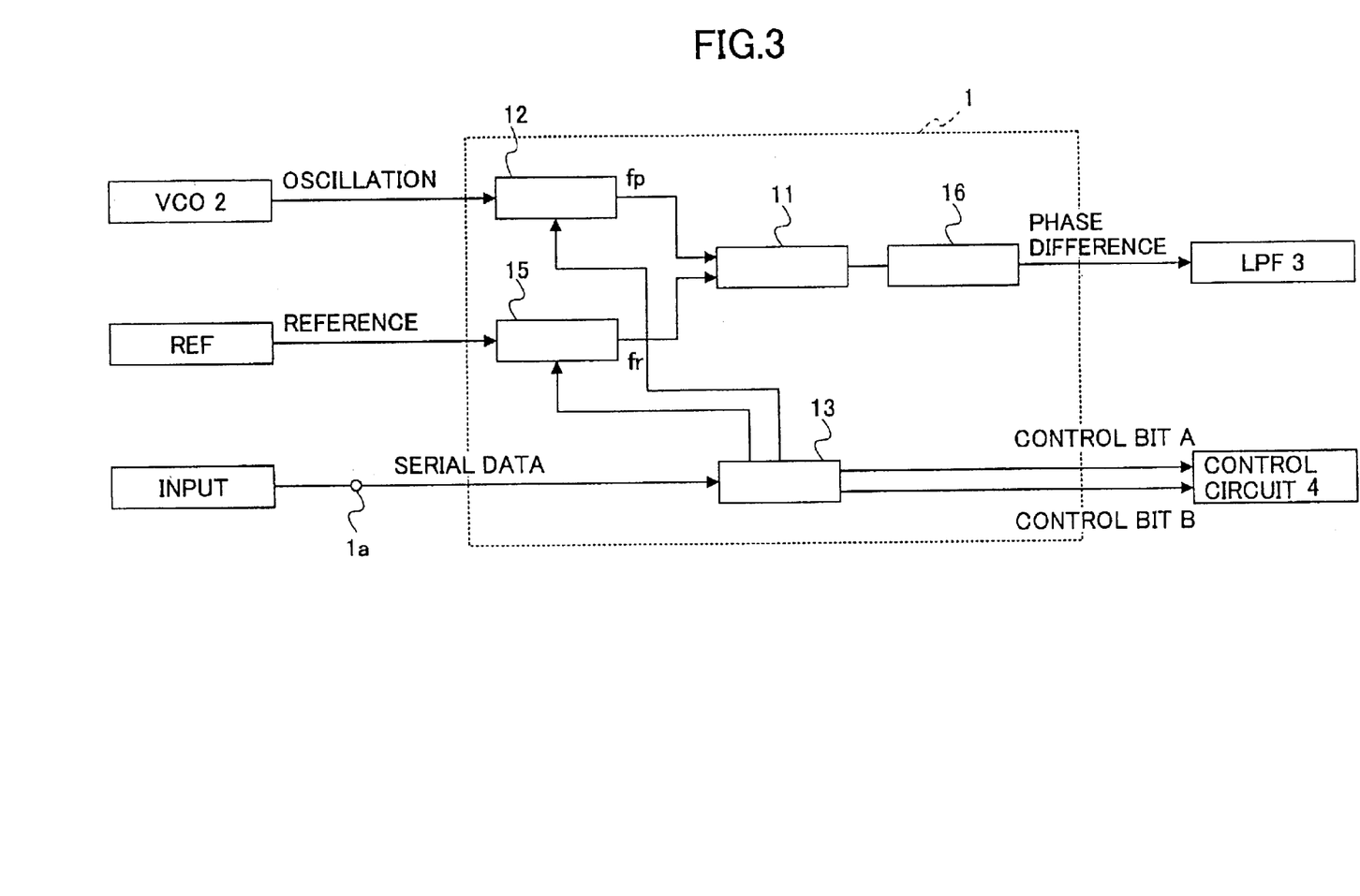
FIG. 3 is a detailed block diagram of a PLL circuit in the frequency synthesizer circuit according to the first embodiment of the present invention.
Figure 4:
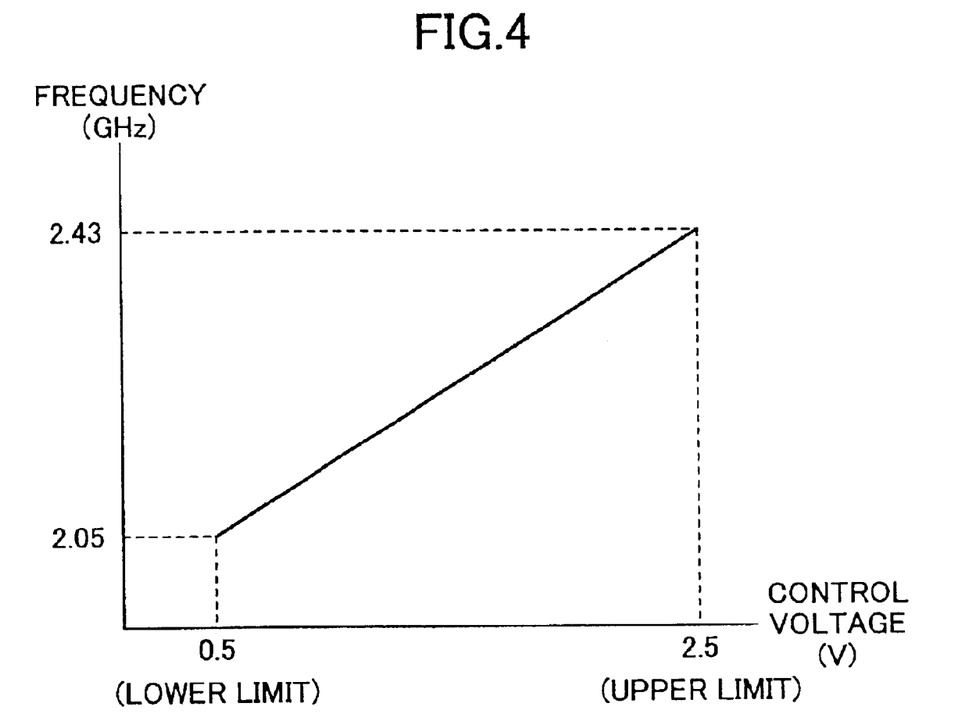
FIG. 4 is a graph representing a characteristic of a voltage controlled oscillator in the frequency synthesizer circuit according to the first embodiment of the present invention.
Figure 5:
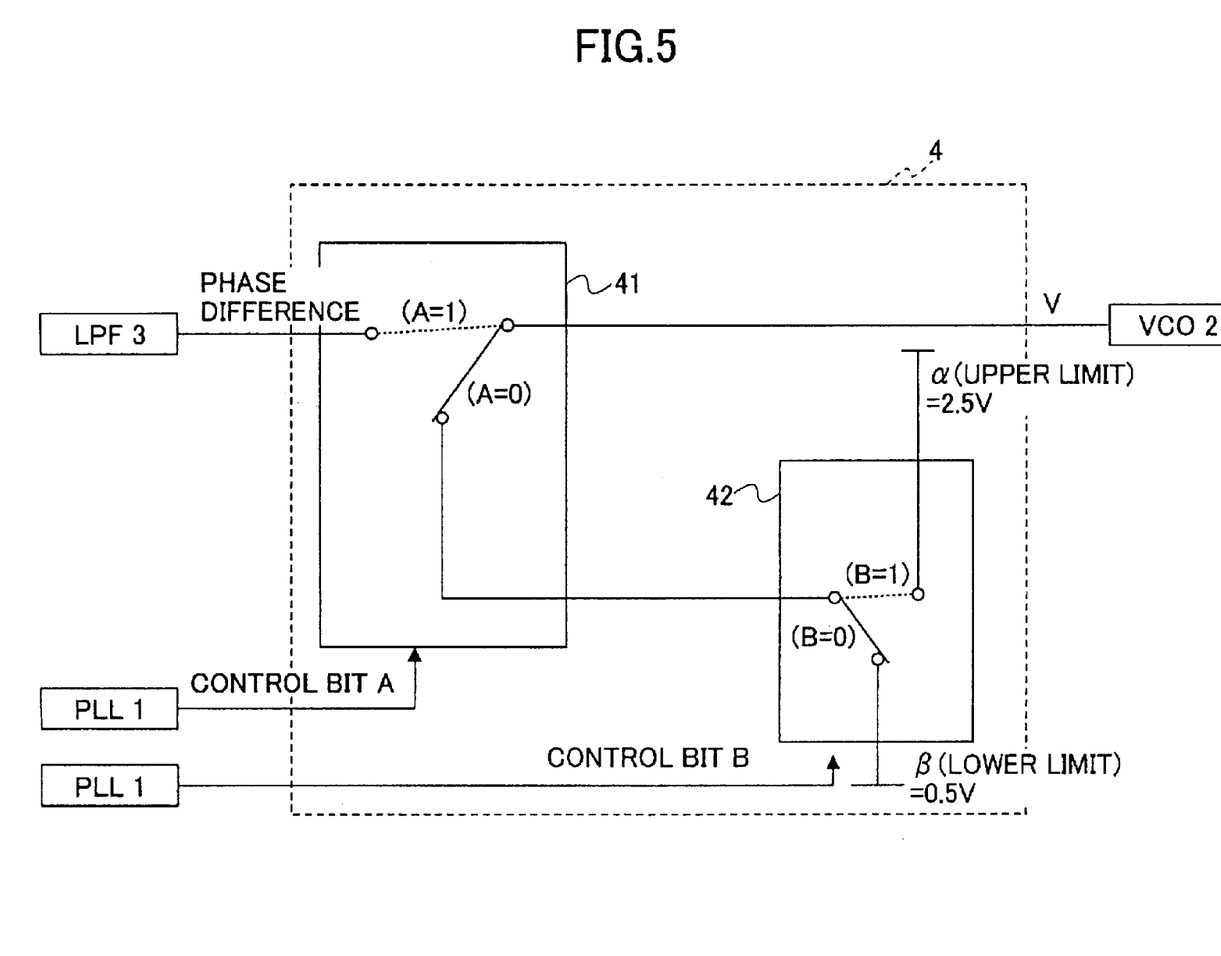
FIG. 5 is a detailed block diagram of a control circuit in the frequency synthesizer circuit according to the first embodiment of the present invention.
Figure 6:
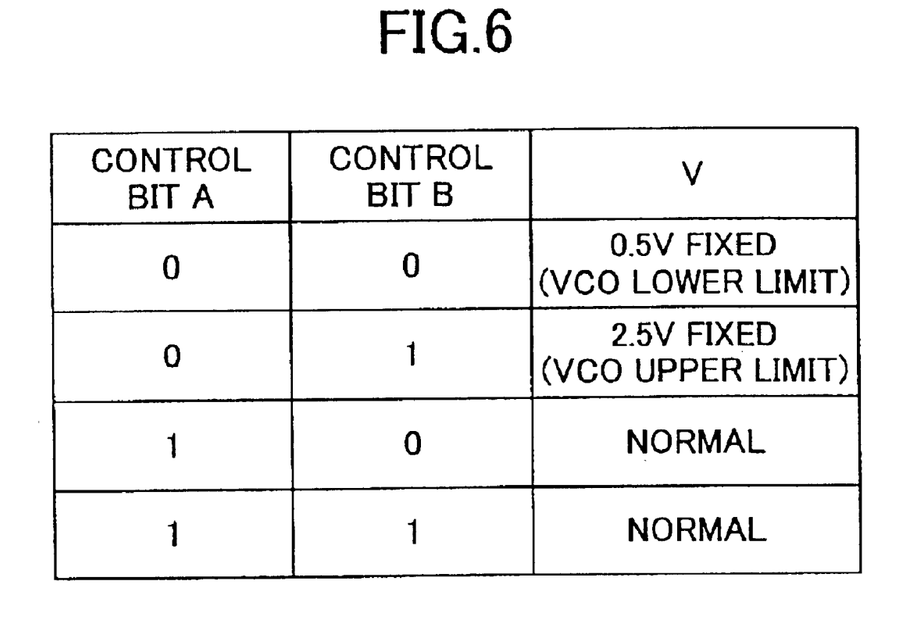
FIG. 6 is a logical diagram (truth table) of a control circuit in the frequency synthesizer circuit according to the first embodiment of the present invention.

The following is a description of a frequency synthesizer circuit according to a first embodiment of the present invention with reference to FIG. 2 through FIG. 6. FIG. 2 is an overall schematic block diagram of the frequency synthesizer circuit according to the first embodiment, FIG. 3 is a detailed block diagram of a PLL circuit in the frequency synthesizer circuit according to the first embodiment, FIG. 4 is a graph representing a characteristic of a voltage controlled oscillator in the frequency synthesizer circuit according to the first embodiment, FIG. 5 is a detailed block diagram of a control diagram in the frequency synthesizer circuit according to the first embodiment, and FIG. 6 is a logical diagram (truth table) of the control circuit in the frequency synthesizer circuit according to the first embodiment.

In each figure mentioned above, the frequency synthesizer circuit 10 according to the first embodiment of the present invention comprises a PLL circuit 1, a voltage controlled oscillator (VCO) 2 connected to the PLL circuit 1, a low pass filter (LPF) 3 connected to the PLL circuit 1, and a control circuit 4, which is characteristic of the present invention. The PLL circuit 1 includes a phase comparator 11 that generates a phase difference signal based on a phase difference between an oscillation signal provided from the VCO 2 and a reference signal provided from a reference signal source REF, a first counter 12, a shift register 13, a second counter 15, and a charge pump 16. The VCO 2 changes a value of the oscillation signal depending on control voltage received from the control circuit 4. The LPF 3 blocks a high frequency component of the phase difference signal provided from the PLL circuit 1. The control circuit 4 is connected to the PLL circuit in order to receive either 2 control bits (a control bit A and a control bit B) as a control signal or the phase difference signal having its high frequency component removed from the LPF 3. The control circuit 4 provides the control voltage to the VCO 2 with a different value based on the control signal or the phase difference signal. The PLL circuit 1, the VCO 2, the LPF 3, and the control circuit 4 are all mounted on a single chip. Also shown in FIG. 2 is a testing device 20 for performing the wafer probing test on the VCO 2. Probes 20a, 20b of the testing device 20 are connected to a terminal 1a and a terminal 2b, respectively, which are formed on the frequency synthesizer circuit 10 according to the first embodiment of the present invention.

As shown in FIG. 3, in the PLL circuit 1, the phase comparator 11 receives the oscillation signal from the VCO 2 via the first counter 12 and the reference signal from the reference signal source via the second counter 15. The phase comparator 11 then detects the phase difference between them. The detected phase difference is provided from the phase comparator 11 to the LPF 3 as the phase difference signal in the form of a pulse. The shift register 13 in the PLL circuit 1 generates the control bit A and the control bit B to be provided to the control circuit 4 based on the control signal included in serial data provided from the testing device 20.

The VCO 2 receives the phase difference signal provided from the PLL circuit 1 via the LPF 3 as the control voltage and generates the oscillation signal based on the control voltage in accordance with the characteristic of the VCO 2 as shown in FIG. 4.

The control circuit 4 serves as a testing unit and provides the control voltage with a different value to the VCO 2 based on the control bits provided from the PLL circuit 1 or the phase difference signal provided from the PLL circuit 1 via the LPF 3. In a normal operation mode, the control circuit 4 provides the control voltage determined from the phase difference signal provided from the PLL circuit 1 via the LPF 3 as mentioned above. However, when the control signal included in the serial data is provided, the control circuit 4 is switched to a testing operation mode and the control circuit 4 provides the control voltage having either the upper limit value or the lower limit value to the VCO 2. As shown in FIG. 5, the control circuit 4 comprises a first switch 41 and a second switch 42. The first switch 41 connects the VCO 2 to either the LPF 3 or the second switch 42. In other words, the VCO 2 is switched between the LPF 3 and the second switch 42. The second switch 42 connects the first switch 41 to either a voltage source α generating voltage of the upper limit value of the control voltage (2.5 V) or a voltage source β generating the voltage of the lower limit value of the control voltage (0.5 V). In other words, the first switch 41 is switched between the voltage source α and the voltage source β. Therefore, the control circuit 4 switches the first switch 41 and the second switch 42 depending on the control bits provided from the PLL circuit 1. More particularly, as shown in FIG. 6, the control circuit 4 provides the control voltage having the lower limit value to the VCO 2 when the value of both the control bits A, B is 0. The control circuit 4 provides the control voltage having the upper limit value to the VCO 2 when the value of the control bit A is 0 and the value of the control bit B is 1. The above two cases indicate that the control circuit 4 is in the testing operation mode. The control circuit 4 provides the control voltage determined from the phase difference signal provided from the PLL circuit 1 in the cases other than those mentioned above. This indicates that the control circuit 4 is in the normal operation mode.

It is noted that the configuration of the control circuit 4 is not limited to that mentioned above. The serial data that determines the control bits A, B is provided to the PLL circuit 1 via the terminal 1a of the frequency synthesizer circuit 10 according to the first embodiment when a probe of the testing device 20 is connected to the terminal 1a at the time of the wafer probing test.

The following is a description of operations of the frequency synthesizer circuit 10 according to the first embodiment of the present invention. The description will be given to the normal operation mode and the testing operation mode. Here, a default value of both the control bits A, B provided from the PLL circuit 1 to the control circuit 4 is set to 1. In other words, the control bits A, B each maintains the value of 1 unless the serial data is provided from the testing device 20, is provided to the PLL circuit 1.

In the normal operation mode, the VCO 2 provides the oscillation signal having an oscillation frequency corresponding to the default values of the control bits A, B to the exterior as well as to the PLL circuit 1 via a branch. In other words, the PLL circuit 1 detects the phase difference between the reference signal from the reference signal source REF and the oscillation signal from the VCO 2, and provides the phase difference as the phase difference signal in the form of a pulse to the LPF 3, which is connected to the PLL circuit 1. The LPF 3 blocks the high frequency component of the phase difference signal received from the PLL circuit 1 and provides the phase difference signal having its high frequency component removed to the control circuit 4. Since the value of each of the control bits A, B received from the PLL circuit 1 is 1, the first switch 41 switches so as to connect the LPF 3 to the VCO 2. Therefore, the control voltage determined from the phase difference signal provided from the PLL circuit 1 via the LPF 3 is provided to the VCO 2. The VCO 2 generates the oscillation signal based on the phase difference signal received as the control voltage. In addition, the normal operation mode is performed when the value of the control bit A is 1 and the value of the control bit B is 0. In such a case, as mentioned above, the first switch 41 switches so as to connect the LPF 3 to the VCO 2 and thus the control voltage determined from the phase difference signal provided from the PLL circuit 1 via the LPF 3 is provided to the VCO 2. The normal operation mode is continued as long as the value of the control bit A is not changed.

In order to switch to the testing operation mode, the serial data that determines the control bits A, B is provided from the testing device 20 through the PLL circuit 1. The following is a description of a case when each of the value of the control bits A, B is changed to 0, from the default value of 1. In such a case, the control circuit 4 switches the first switch 41 so as to connect the VCO 2 to the second switch 42. The control circuit 4 also switches the second switch 42 so as to connect the first switch 41 to the voltage source β. Accordingly, the control voltage having the lower limit value (0.5 V) is provided to the VCO 2. At this point, if the VCO 2 generates the oscillation signal having a predetermined frequency oscillation according to the control voltage with the lower limit value, it can be determined that the VCO 2 is working properly. If the VCO 2 cannot generate the oscillation signal having the predetermined frequency oscillation according to the control voltage with the lower limit value, it can be determined that the VCO 2 has a failure.

Next, the value of control bit A may be maintained the same, i.e. 0, and the value of the control bit B may be changed to 1 from the value of 0 when the serial data that determines the control bits A, B is provided from the testing device 20. In this case, the control circuit 4 switches the switch 41 so as to connect the VCO 2 to the second switch 42. The control circuit 4 also switches the second switch 42 so as to connect the first switch 41 to the voltage source α. Accordingly, the control voltage having the upper limit value (2.5 V) is provided to the VCO 2. As in the case mentioned above, at this point, if the VCO 2 generates the oscillation signal having a predetermined frequency oscillation according to the control voltage with the upper limit value, it can be determined that the VCO 2 is working properly. If the VCO 2 cannot generate the oscillation signal having a predetermined frequency oscillation according to the control voltage with the upper limit value, it can be determined that the VCO 2 has a failure.

In the frequency synthesizer circuit according to the first embodiment of the present invention, the control circuit 4 is in the normal operation mode when the value of the control bit A is 1 and thus the first switch 41 connects the LPF 3 to the VCO 2. Therefore, the phase difference signal provided from the PLL circuit 1 is provided to the VCO 2 via the LPF 3 as the control voltage and the VCO 2 generates the oscillation signal having the predetermined oscillation frequency in accordance with the phase difference signal. The control circuit 4 is in the testing operation mode, in which the wafer probing test is to be performed to check the oscillation frequency provided from the VCO 2, when the values of the control bits A, B are changed from the default values. Therefore, the control voltage having either the upper limit value or the lower limit value is provided to the VCO 2 so as to determine whether the VCO 2 can generate the oscillation signal having an appropriate oscillation frequency according to the control voltage. Therefore, the wafer-probing test can be easily performed before the assembly of the frequency synthesizer circuit into the final product.

Figure 7:
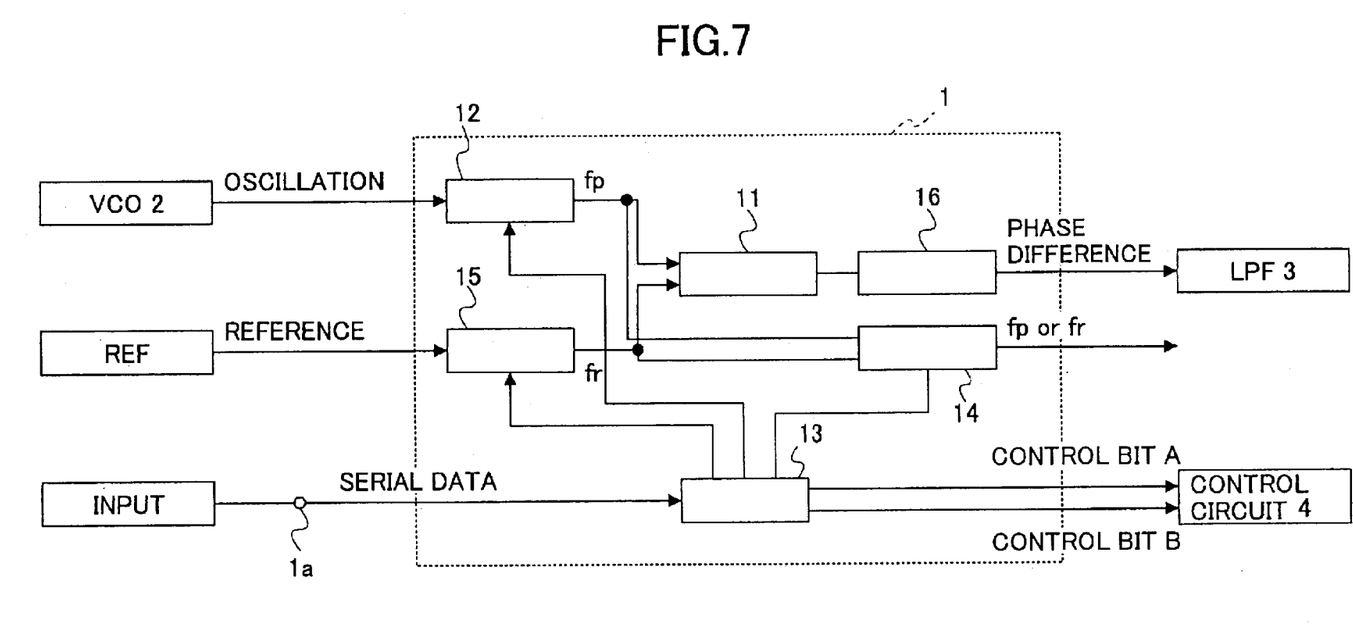
FIG. 7 is a detailed block diagram of a PLL circuit with a modification in the frequency synthesizer circuit according to the first embodiment of the present invention.

It is noted that, in the frequency synthesizer circuit according to the first embodiment, as shown in FIG. 7, a selector 14 may be further provided in the PLL circuit 1 so as to receive the reference signal provided from the reference signal source REF and the oscillation signal provided from the VCO 2 as similar to the phase comparator 11. The wafer-probing test can also be performed by switching the selector 14 so as to provide either the reference signal or the oscillation signal. Normally, when the oscillation frequency of the oscillation signal exceeds several giga hertz, the direct reading out of the oscillation signal provided from the VCO 2 by the probe of the testing device 20 may present a problem since the frequency band is high. However, since the oscillation signal passes through the first counter 12, which divides the frequency of the oscillation signal, so that the signal can be used in the phase comparator 11, the probe of the testing device 20 can read out the oscillation signal with an admissible frequency band. Therefore, the wafer-probing test can be easily performed.

Figure 8:
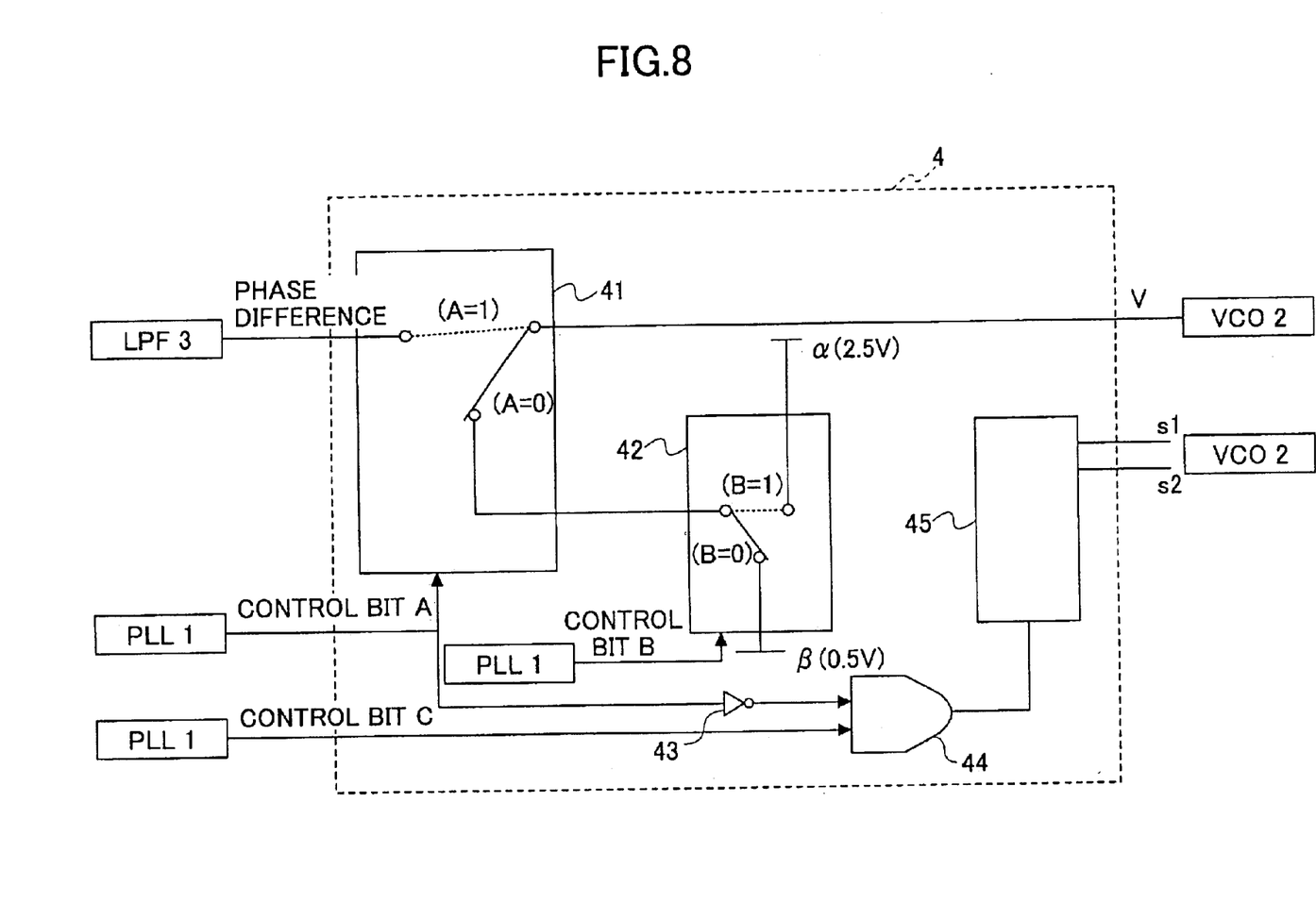
FIG. 8 is a detailed block diagram of a control circuit in a frequency synthesizer circuit according to a second embodiment of the present invention.

The following is a description of the frequency synthesizer circuit according to a second embodiment of the present invention with reference to FIG. 8. FIG. 8 is a detailed block diagram of a control circuit in the frequency synthesizer circuit according to the second embodiment.

The frequency synthesizer circuit according to the second embodiment is configured similarly to the frequency synthesizer circuit according to the first embodiment. In addition to the configuration of the first embodiment, the second embodiment is configured so as to use 3 control bits A, B, and C as compared to 2 control bits A, B in the first embodiment.

As shown in FIG. 8, the control circuit 4 includes, in addition to the configuration of the first embodiment shown in FIG. 5, a NOT element 43, an AND gate element 44 receiving the control bit A from the PLL circuit 1 via the NOT gate element 43 and the control bit C from the PLL circuit 1, and a selector 45 receiving a control bit provided from the AND gate element 44. The selector 45 provides channel selection signals s1, s2 according to the control bit provided from the AND gate element 44.

Figure 9:
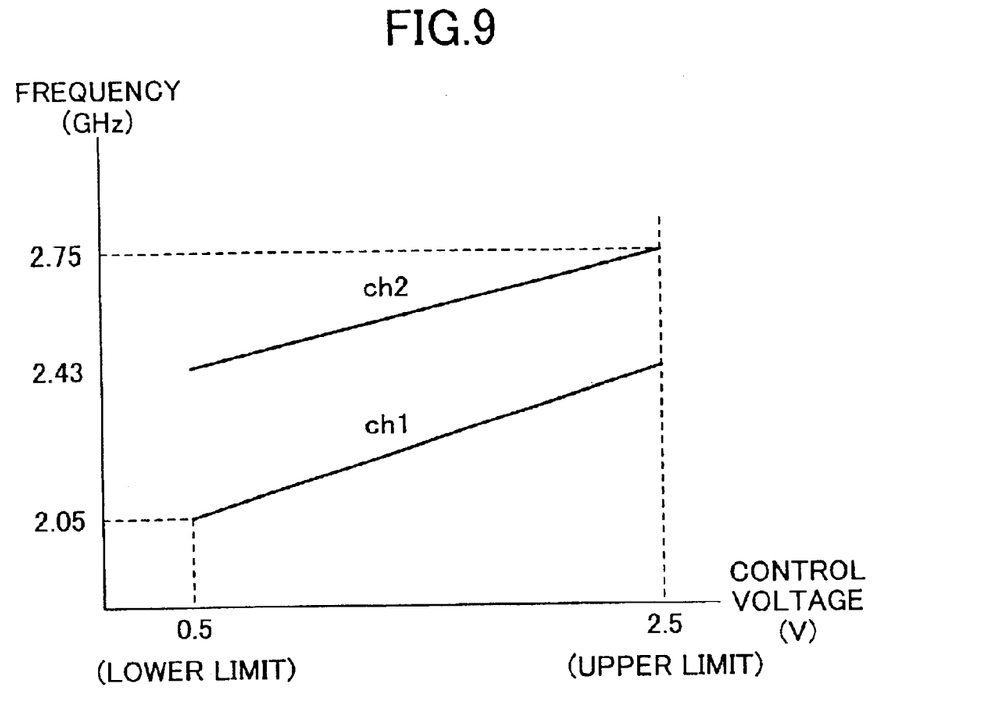
FIG. 9 is a graph representing a characteristic of a voltage controlled oscillator in the frequency synthesizer circuit according to the second embodiment of the present invention.
Figure 10:
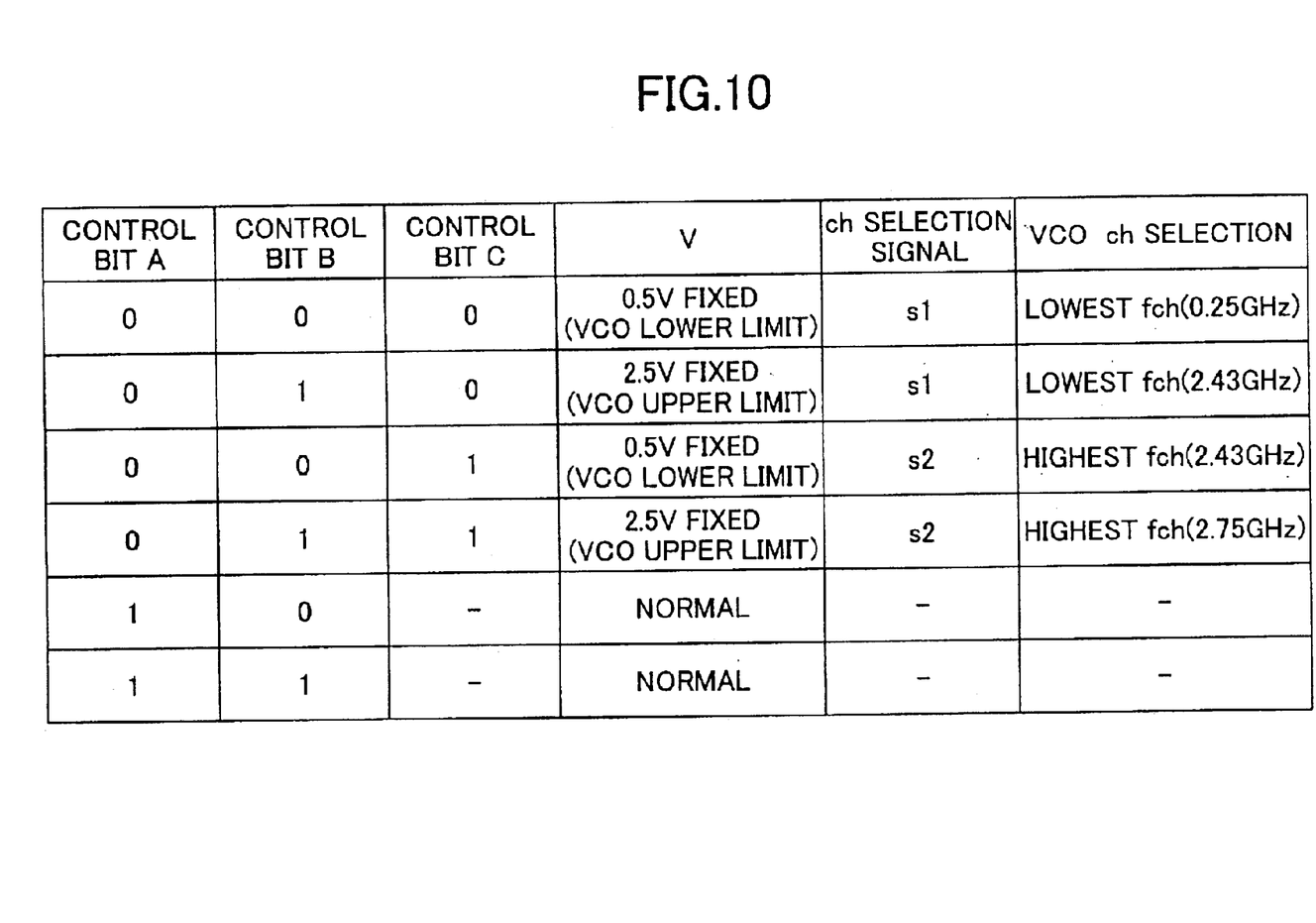
FIG. 10 is a logical diagram (truth table) of a control circuit in the frequency synthesizer circuit according to the second embodiment of the present invention.

In addition to the configuration of the first embodiment shown in FIG. 5, the VCO 2 in the second embodiment provides the oscillation signal according to either the frequency bands ch1 (2.05–2.43 GHz) or the frequency band ch2 (2.43–2.75 GHz), which is higher than the frequency band ch1 as shown in FIG. 9. The VCO 2 generates the oscillation signal according to either the oscillation frequency band ch1 or the oscillation frequency band ch2 depending on the channel selection signals s1, s2 provided from the selector 45. As shown in FIG. 10, when the value of each of the control bits A, C is 0, regardless of the value of the control bit B, the control circuit 4 provides the channel selection signal s1 to the VCO 2 so that the VCO 2 provides the oscillation signal according to the oscillation frequency band ch1. Also, when the value of the control bit A is 0 and the value of the control bit C is 1, regardless of the value of the control bit B, the control circuit 4 provides the channel selection signal s2 to the VCO 2 so that the VCO 2 provides the oscillation signal according to the oscillation frequency band ch2.

The frequency synthesizer circuit according to the second embodiment operates similarly to the first embodiment of the present invention. In addition to the operations of the first embodiment, the frequency synthesizer circuit according to the second embodiment operates as described below. When the value of both the control bits A, C provided from the testing device 20 via the PLL circuit 1 to the control circuit 4 is 0, and further the value of the control bit B, which is also provided from the testing device 20 via the PLL circuit 1 to the control circuit 4 is 0, the channel selection signal s1 is provided to the VCO 2 so that the VCO 2 provides the oscillation signal having the oscillation frequency corresponding to the lower limit of the lowest frequency band ch1, i.e. 2.05 GHz. When the value of both the control bit A, C is 0, and further the value of the control bit B is 1, the channel selection signal s1 is provided to the VCO 2 so that the VCO 2 provides the oscillation signal having the oscillation frequency corresponding to the upper limit of the lowest frequency band ch1, i.e. 2.43 GHz. When the value of the control bit A is 0 and the value of the control bit C is 1, and further the value of the control bit B is 0, the channel selection signal s2 is provided to the VCO 2 so that the VCO 2 provides the oscillation signal having the oscillation frequency corresponding to the lower limit of the highest frequency band ch2, i.e. 2.43 GHz. When the value of the control bit A is 0 and the value of the control bit C is 1, and further the value of the control bit B is 1, the channel selection signal s2 is provided to the VCO 2 so that the VCO 2 provides the oscillation signal having the oscillation frequency corresponding to the upper limit of the highest frequency band ch1, i.e. 2.75 GHz. In the cases other than those mentioned above, the control circuit 4 is in the normal operation mode, during which the oscillation signal with the predetermined oscillation frequency according to the phase difference detected in the PLL circuit 1 is provided from the VCO 2.

In the frequency synthesizer circuit according to the second embodiment, the VCO 2 may be provided with 2 oscillation frequency bands. The additional use of the control bit C in addition to the control bits A, B, which are used in the frequency synthesizer according to the first embodiment, allows performing the wafer-probing test so as to check the oscillation frequency provided from such a VCO 2. The values of the control bit A, the control bit B, and the control bit C are changed accordingly so as to provide the oscillation signal with the oscillation frequency corresponding to the lower limit of the lowest frequency band, the oscillation signal with the oscillation frequency corresponding to the upper limit of the lowest frequency band ch1, the oscillation signal with the oscillation frequency corresponding to the lower limit of the highest frequency band ch2, and the oscillation signal with the oscillation frequency corresponding to the upper limit of the highest frequency band ch2. It is possible to determine if the VCO 2 is working properly or not by determining whether the VCO 2 is providing the oscillation signal with the appropriate oscillation frequency according to the different frequency band based on the control voltage provided from the control circuit 4. Thus the wafer-probing test can be easily performed before the assembly of the frequency synthesizer circuit.

It is noted that in the frequency synthesizer circuit according to the second embodiment, more than 2 frequency bands may be employed by increasing the number of control bits to be used.

Figure 11:
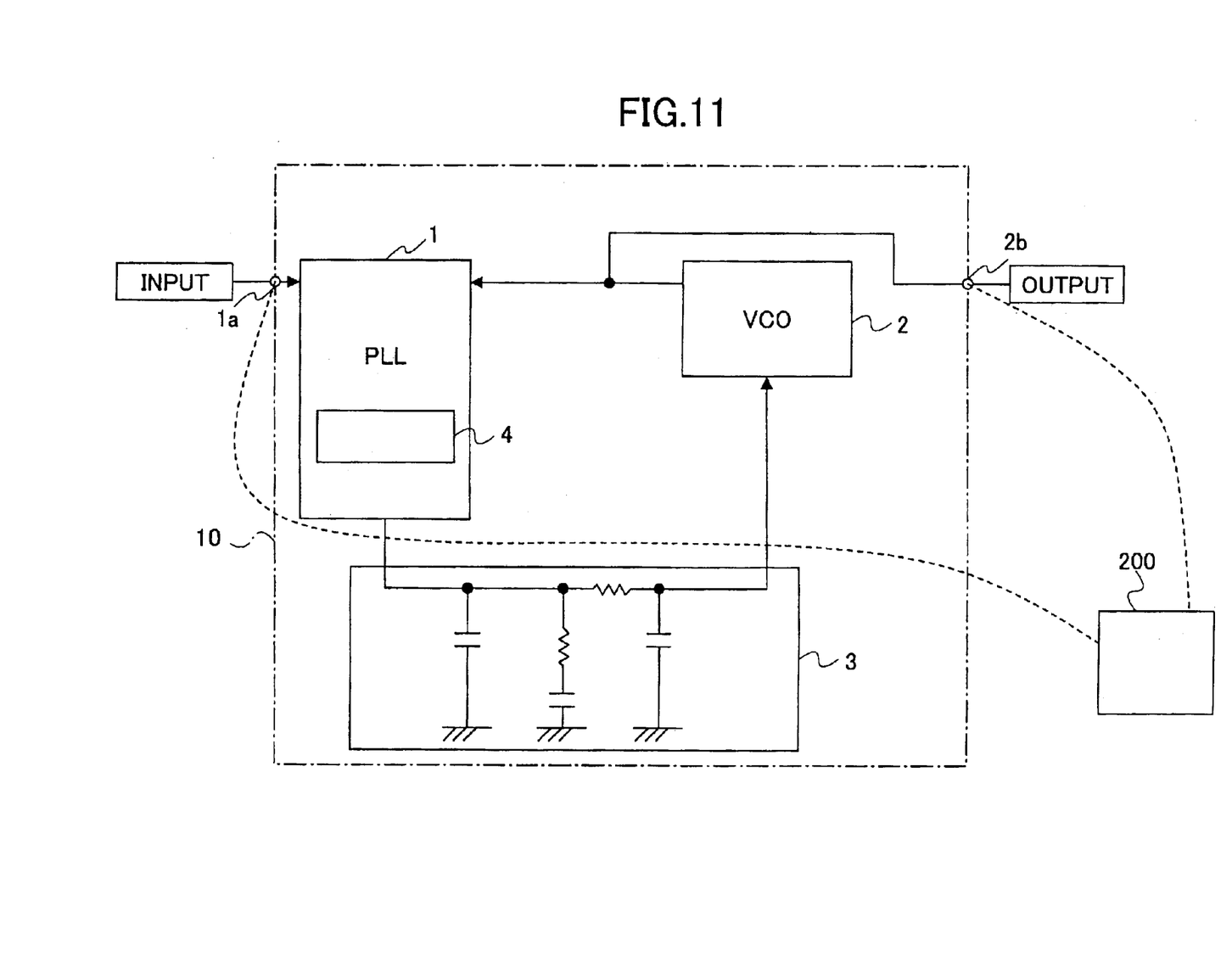
FIG. 11 is an overall schematic block diagram of a frequency synthesizer circuit according to another embodiment of the present invention.

FIG. 11 shows a frequency synthesizer circuit according to another embodiment of the present invention. As shown in FIG. 11, the frequency synthesizer circuit according to another embodiment is configured similarly to the frequency synthesizer according to the first embodiment, however, the LPF 3 may be constructed as a passive filter and the control circuit 4 may be located in the PLL circuit 1 instead of between the VCO 2 and the LPF 3 as in the frequency synthesizer according to the first embodiment. Therefore, the control voltage may be provided to the VCO 2 via the passive filter, which is configuring the LPF 3, without directly connecting the control circuit 4 to the VCO 2.

Further, the present invention is not limited to the above-described embodiments, and variations and modifications may be made without departing from the scope of the present invention.

The present application is based on Japanese priority application No. 2002-145304, filed on May 20, 2002, the entire contents of which are hereby incorporated by reference.

What is claimed is:

1. A frequency synthesizer circuit comprising:
a phase-locked loop circuit;
a voltage controlled oscillator;
a low pass filter;
an input terminal for providing serial data provided from the exterior to said phase-locked loop circuit;
an output terminal for providing an oscillation signal provided from said voltage controlled oscillator; and
a testing unit providing a testing voltage with a binary value to said voltage controlled oscillator, wherein,
said phase-locked loop circuit, said voltage controlled oscillator, said low pass filter, and said testing unit are mounted on a single chip; and
usability of said frequency synthesizer circuit is determined based on the oscillation signal provided from said voltage controlled oscillator via said output terminal according to the testing voltage with a binary value provided from said testing unit.

2. The frequency synthesizer circuit as claimed in claim 1, wherein:
said testing unit is provided between said low pass filter and said voltage controlled oscillator; and
said testing unit provides the testing voltage with a binary value based on a control signal included in the serial data provided from said phase-locked loop circuit.

3. The frequency synthesizer circuit as claimed in claim 1, wherein:
said testing unit is provided in said phase-locked loop circuit and said low pass filter is configured as a passive filter, wherein
the testing voltage with a binary value provided from said testing unit is provided to said voltage controlled oscillator via said low pass filter.

4. The frequency synthesizer circuit as claimed in claim 1, wherein:
said voltage controlled oscillator provides the oscillation signal corresponding to a frequency band of a plurality of channels;
said testing unit switches a channel of said voltage controlled oscillator based on a channel selection signal provided from said phase-locked loop circuit; and
usability of said frequency synthesizer circuit is determined based on the oscillation signal provided from said voltage controlled oscillator via said output terminal according to the testing voltage with a binary value provided from said testing unit.

5. The frequency synthesizer circuit as claimed in claim 1, wherein:
said phase-locked loop circuit comprises a divider counter to divide a frequency of the oscillation signal provided from said voltage controlled oscillator by counting pulses of the oscillation signal and an output terminal, wherein
the divided oscillation signal is provided from said output terminal.

6. A frequency synthesizer circuit comprising:
a voltage controlled oscillator;
a phase-locked loop circuit receiving an oscillation signal provided from said voltage controlled oscillator and a given signal in order to generate a phase difference signal by detecting a phase difference between the oscillation signal and the given signal;
a testing unit providing a predetermined testing voltage to said voltage controlled oscillator, wherein
said phase-locked loop circuit further receives serial data provided from the exterior in order to provide a control signal to said testing unit;
said testing unit provides the predetermined testing voltage according to the control signal provided from said phase-locked loop circuit; and
said voltage controlled oscillator provides the oscillation signal based on the phase difference signal provided from the phase-locked loop circuit in a normal operation mode and provides the oscillation signal based on the predetermined testing voltage provided from said testing unit in a testing operation mode.

7. The frequency synthesizer circuit as claimed in claim 6, said frequency synthesizer circuit further comprising a low pass filter to be inserted between said phase-locked loop circuit and said testing unit.

8. The frequency synthesizer circuit as claimed in claim 6, wherein:
said voltage controlled oscillator provides the oscillation signal having an oscillation frequency corresponding to any one of a plurality of frequency bands;
said testing unit provides a testing voltage with a different value to said voltage controlled oscillator according to the control signal provided from said phase-locked loop circuit; and
said voltage controlled oscillator provides said oscillation signal having the oscillation frequency corresponding one of the plurality of frequency bands based on the testing voltage with a different value provided from said testing unit.

* * * * *

UNITED STATES PATENT AND TRADEMARK OFFICE
CERTIFICATE OF CORRECTION

PATENT NO. : 6,806,782 B2   Page 1 of 1
DATED : October 19, 2004
INVENTOR(S) : Motoyoshi et al.

It is certified that error appears in the above-identified patent and that said Letters Patent is hereby corrected as shown below:

Title page,
Item [73], Assignee, should read as follows: -- Fujitsu Limited, Kawasaki (JP) --

Signed and Sealed this

First Day of February, 2005

JON W. DUDAS
*Director of the United States Patent and Trademark Office*